US011545289B2

United States Patent
Shaffer et al.

(10) Patent No.: US 11,545,289 B2
(45) Date of Patent: Jan. 3, 2023

(54) SOLENOID ASSEMBLY WITH INCLUDED CONSTANT-CURRENT CONTROLLER CIRCUIT

(71) Applicant: Hanchett Entry Systems, Inc., Phoenix, AZ (US)

(72) Inventors: Randall Shaffer, Phoenix, AZ (US); Brett L. Davis, Gilbert, AZ (US)

(73) Assignee: Hanchett Entry Systems, Inc., Phoenix, AZ (US)

(*) Notice: Subject to any disclaimer, the term of this patent is extended or adjusted under 35 U.S.C. 154(b) by 0 days.

(21) Appl. No.: 17/078,135

(22) Filed: Oct. 23, 2020

(65) Prior Publication Data

US 2021/0043351 A1 Feb. 11, 2021

Related U.S. Application Data

(60) Division of application No. 16/406,464, filed on May 8, 2019, now Pat. No. 10,964,467, which is a
(Continued)

(51) Int. Cl.
*H01F 7/06* (2006.01)
*H01F 41/02* (2006.01)
(Continued)

(52) U.S. Cl.
CPC ........... *H01F 7/064* (2013.01); *H01F 7/1838* (2013.01); *H01F 41/02* (2013.01); *H05K 1/18* (2013.01);
(Continued)

(58) Field of Classification Search
CPC ........ H01F 7/064; H01F 7/1838; H01F 41/02; H05K 1/18; H05K 7/1427; H05K 2201/09018
See application file for complete search history.

(56) References Cited

U.S. PATENT DOCUMENTS 3,663,949 A 5/1972 Froeschle
3,894,417 A * 7/1975 Taniyama ........... E05B 47/0661
70/156
(Continued)

FOREIGN PATENT DOCUMENTS

CA 2789888 3/2013
CN 204065891 12/2014
(Continued)

OTHER PUBLICATIONS

Howe, "How to Replace a Tailgate Lock Solenoid" pp. 1-3, 2016 (Year: 2016).*
(Continued)

*Primary Examiner* — Pinping Sun
(74) *Attorney, Agent, or Firm* — Woods Oviatt Gilman LLP; Dennis B. Danella, Esq.

(57) ABSTRACT

A constant-current controller that supplies a constant-current to a solenoid driver for use with an electromechanical device. The controller comprises a PCB containing a constant-current control circuit. The circuit comprises a GaN-FET primary switch and a secondary switch. The PCB is integrated with and made a part of the solenoid driver. A standard electromechanical device may be converted to a constant-current controlled electromechanical device by exchanging the solenoid driver.

17 Claims, 6 Drawing Sheets

SECTION A-A

Related U.S. Application Data continuation-in-part of application No. 15/098,522, filed on Apr. 14, 2016, now Pat. No. 10,378,242.

(60) Provisional application No. 62/147,478, filed on Apr. 14, 2015.

(51) Int. Cl.
    *H05K 1/18*     (2006.01)
    *H05K 7/14*     (2006.01)
    *H01F 7/18*     (2006.01)

(52) U.S. Cl.
    CPC .. *H05K 7/1427* (2013.01); *H05K 2201/09018* (2013.01)

(56) References Cited

U.S. PATENT DOCUMENTS

| | | | |
|---|---|---|---|
| 4,102,526 A | 7/1978 | Hargraves | |
| 4,536,728 A | 8/1985 | Cyrot | |
| 4,542,440 A | 9/1985 | Chetty et al. | |
| 4,841,207 A | 6/1989 | Cheyne | |
| 4,872,100 A | 10/1989 | Diaz | |
| 5,100,184 A | 3/1992 | Schmitt | |
| 5,343,759 A | 9/1994 | Hesthamar et al. | |
| 5,432,693 A | 7/1995 | Anderson | |
| 5,673,166 A | 9/1997 | Hoffman | |
| 5,933,067 A * | 8/1999 | Frolov | E05B 47/00 335/251 |
| 6,352,317 B1 * | 3/2002 | Blazic | B60T 8/3675 303/119.2 |
| 6,356,043 B2 | 3/2002 | Baum | |
| 6,384,711 B1 * | 5/2002 | Cregger | G07C 9/27 70/277 |
| 6,934,140 B1 | 8/2005 | Rober et al. | |
| 7,046,111 B2 * | 5/2006 | Sigl | H01F 3/14 336/178 |
| 7,106,593 B2 | 9/2006 | Stabile et al. | |
| 7,158,361 B2 | 1/2007 | Horn | |
| 7,212,173 B2 | 5/2007 | Chen et al. | |
| 7,430,102 B2 | 9/2008 | Groh et al. | |
| 7,813,101 B2 | 10/2010 | Morikawa | |
| 8,294,304 B1 | 10/2012 | Ledbetter et al. | |
| 8,295,695 B2 | 10/2012 | Yoshida et al. | |
| 8,454,063 B2 | 6/2013 | David et al. | |
| 8,503,152 B2 * | 8/2013 | Feltz | H01F 7/1615 361/206 |
| 8,941,417 B2 | 1/2015 | Dornseifer et al. | |
| 9,022,350 B2 | 5/2015 | Jung | |
| 9,183,976 B2 | 11/2015 | Hanchett, Jr. et al. | |
| 9,787,315 B1 | 10/2017 | Watanabe et al. | |
| 10,371,016 B2 * | 8/2019 | McCarthy, Jr. | F01L 1/18 |
| 2001/0032999 A1 * | 10/2001 | Yoshida | H01L 29/7455 257/332 |
| 2003/0053279 A1 | 3/2003 | Meehleder et al. | |
| 2003/0128555 A1 | 7/2003 | Schemmann et al. | |
| 2004/0057183 A1 | 3/2004 | Vincent et al. | |
| 2005/0180078 A1 * | 8/2005 | Sievers | H01F 7/1827 361/103 |
| 2005/0194052 A1 * | 9/2005 | Gandrud | F16K 31/06 137/884 |
| 2006/0221534 A1 | 10/2006 | Oide | |
| 2007/0120498 A1 | 5/2007 | Caiafa et al. | |
| 2008/0238391 A1 | 10/2008 | Williams et al. | |
| 2009/0237856 A1 | 9/2009 | Ishitsuka et al. | |
| 2009/0256534 A1 | 10/2009 | Videtich et al. | |
| 2010/0045053 A1 | 2/2010 | Dye et al. | |
| 2010/0082169 A1 | 4/2010 | Crist et al. | |
| 2010/0156314 A1 | 6/2010 | Wang et al. | |
| 2011/0241629 A1 | 10/2011 | Jordan | |
| 2013/0113579 A1 * | 5/2013 | Barnas | H01H 71/68 335/166 |
| 2013/0249537 A1 * | 9/2013 | Kahl | G01B 7/00 324/207.16 |
| 2014/0109479 A1 * | 4/2014 | Morstatt | E05B 65/1093 49/32 |
| 2016/0307683 A1 | 10/2016 | Davis et al. | |
| 2016/0310149 A1 * | 10/2016 | Downey | A61B 5/0225 |
| 2017/0279287 A1 | 9/2017 | Solodovnik et al. | |
| 2018/0075961 A1 | 5/2018 | Davis et al. | |
| 2018/0279566 A1 * | 10/2018 | Wlassich | A01G 25/162 |
| 2019/0267173 A1 | 8/2019 | Shaffer et al. | |
| 2021/0012938 A1 * | 1/2021 | Dams | H01F 41/061 |

FOREIGN PATENT DOCUMENTS

| | | | |
|---|---|---|---|
| DE | 102008014976 | 11/2008 | |
| EP | 1437463 | 7/2004 | |
| FR | 2352381 | 12/1977 | |
| GB | 2479740 | 10/2011 | |
| GB | 2557973 | 7/2018 | |
| WO | WO-2005030528 A2 * | 4/2005 | ............ B60T 8/3675 |
| WO | 2014028332 | 2/2014 | |

OTHER PUBLICATIONS

Watt, John, "Examination Report under Section 18(3)", UK Patent Application No. GB2006165.1 filed Apr. 27, 2020, dated Jul. 15, 2021.
Don Wilcher, "Learn Electronics with Ardurino," Jul. 2012, p. 74-75, Apress, 1st ed.
Watt, John, "Combined Search and Examination Report under Sections 17 and 18(3)"; report dated Apr. 9, 2021 for Application No. GB2017818.2; UK Intellectual Patent Office, South Wales.
Watt, John, "Combined Search and Examination Report under Sections 17 and 18(3)", UK Patent Application No. GB2006165.1 filed Apr. 27, 2020, dated Sep. 24, 2020.
Sun, Pinping, "Office Action", U.S. Appl. No. 16/406,464, filed May 8, 2019, dated Sep. 24, 2020.
Sun, Pinping, "Notice of Allowance", U.S. Appl. No. 16/406,464, filed May 8, 2019, dated Dec. 17, 2020.
Sun, Pinping, "Office Action", U.S. Appl. No. 17/078,134, filed Oct. 23, 2020, dated Dec. 1, 2021.
Sun, Pinping, "Notice of Allowance", U.S. Appl. No. 17/078,134, filed Oct. 23, 2020, dated Apr. 20, 2022.
Martin, Tom "Examination Report under Section 18(3)", dated Jun. 28, 2022 for United Kingdom Application No. GB2006165.1, South Wales, United Kingdom, 3 pages.

* cited by examiner

SECTION B-B

SECTION A-A

SOLENOID ASSEMBLY WITH INCLUDED CONSTANT-CURRENT CONTROLLER CIRCUIT

CROSS REFERENCE TO RELATED APPLICATIONS

This application is a divisional of pending U.S. patent application Ser. No. 16/406,464, filed May 8, 2019, which is a continuation-in-Part of U.S. patent application Ser. No. 15/098,522, filed Apr. 14, 2016, now U.S. Pat. No. 10,378,242, entitled CONSTANT-CURRENT CONTROLLER FOR INDUCTIVE LOAD which claims the benefit of U.S. Provisional Patent Application No. 62/147,478, filed Apr. 14, 2015, the contents of which are hereby incorporated by reference in their entirety.

TECHNICAL FIELD

The present invention relates to a constant-current controller for an inductive load such as a solenoid driver. Specifically, the invention relates to a constant-current controller circuitry contained on a Printed Circuit Board (PCB) that is integrated with and made a part of the solenoid driver of an electromechanical device. Because the constant-current circuitry can be packaged as part of the solenoid driver itself in accordance with the invention, upgrading an electromechanical device to the advantages of a constant-current controller is simplified. The electromechanical device may be an electronically actuated door latch mechanism.

BACKGROUND OF THE INVENTION

Solenoids are often used as the driver to operate many types of electromechanical devices, such as for example electromechanical door latches or strikes. In the use of solenoids as drivers in electromechanical door latches or strikes, when power is applied to the solenoid, the solenoid is powered away from the default state to bias a return spring. The solenoid will maintain the bias as long as power is supplied to the solenoid. Once power has been intentionally removed, or otherwise, such as through a power outage from the grid or as a result of a fire, the solenoid returns to its default position. Depending on the type latch or strike (fail-safe or fail-secure), the default position may place the latch in a locked (fail-secure) or unlocked (fail-safe) state. In a "fail-safe" system, as long as the latch or strike remains locked, power has to be supplied to the solenoid to maintain stored energy in the return spring. In a "fail-secure" system, the opposite is true.

The current to pull in the plunger of the solenoid against the return spring is referred to as the "pick" current and the current to hold the plunger against the return spring is referred to as the "hold" current. Typically, the pick current is much greater than the hold current regardless of whether the solenoid is used in a "fail-safe" or "fail-secure" system. Power provided to the solenoid of an electric latch or strike is most efficiently maintained if a constant current is provided to the inductive load.

In U.S. patent application Ser. No. 15/098,522 and assigned to Hanchett Entry Systems, Inc. (the "Parent Application"), a constant-current controller circuitry operable to supply a constant current to an inductive load is disclosed. The circuitry includes a switching circuit comprising a primary switch and a secondary switch. The switches are sequentially opened and closed as timed events whereby a periodic current to the solenoid becomes constant when a sufficiently large switching frequency is implemented. The controller may be operated as a pulse-width modulated controller. In one aspect of the circuit disclosed, the primary switch is a MOSFET.

Because of the size of the MOSFET, the PCB containing the MOSFET and supporting components is relatively large and substantially rigid, and therefore must be mounted remote from the solenoid and typically in the housing of the electric latch or strike remote. Thus, since the controller circuitry is made an integral part of the latch or strike itself when manufactured, retrofitting of an existing electromechanical door latch or strike with constant current controller circuitry is difficult and costly.

Therefore, there exists a need for a constant-current controller circuit to be integrated with an associated solenoid so that a constant current controlled solenoid may serve as a drop-in replacement for a standard solenoid of any solenoid-driven device.

SUMMARY OF THE INVENTION

What is presented is a constant-current controller that supplies a constant current to an inductive load. The inductive load is composed of an inductance (L) and series resistance (R). The controller comprises a switching circuit. The switching circuit comprises a primary switch and a secondary switch (see the schematic in FIG. 1). During a time interval in which the primary switch is closed ($t_{on}$), the secondary switch is open and the voltage across the inductive load is equal to the source voltage ($V_s$). At time $t_{on}$ until the end of a time period (T), with the primary switch open and the secondary switch closed, zero volts appears across the inductive load. During this interval, load current continues to flow due to the stored energy in the inductance. The periodic current in the inductive load is dependent upon the stored energy, the parameters of the control circuit, and the duration of $t_{on}$.

In certain embodiments, the controller further operates as a pulse-width modulation (PWM) controller that causes the periodic current in the inductive load to become constant by implementing a sufficiently large switching frequency. As the frequency increases, the boundary current and the peak current approach the same constant value. In certain embodiments of this controller, the inductive load can be a solenoid, DC motor, or a magnetic actuator. In certain embodiments of this controller, the primary switch may be a GaNFET and the secondary switch is a free-wheeling diode. Although not a requirement, the inductive load can be used to lock or unlock an electromechanical door latch or electromechanical strike.

Also presented is constant-current controller circuit including a GaNFET as the primary switch wherein the GaNFET and its associated electronic components are mounted on a PCB and wherein the PCB is integrated with and made part of a solenoid assembly.

What is also presented is a method of retrofitting a electromechanical device with constant-current controller circuitry. This method comprises the steps a) providing a first electromechanical device without a constant-current controller circuit wherein the first electromechanical device includes a first solenoid assembly comprising a solenoid driver and a housing; b) removing the first solenoid assembly; c) providing a second solenoid assembly comprising a solenoid driver and PCB; d) replacing the removed first solenoid assembly with the second solenoid assembly; and e) making the required feed wire connections to convert the first electromechanical device to a second electromechanical device having the constant-current controller circuit.

In one embodiment of the method, the PCB of the second solenoid assembly is mounted to the housing adjacent the solenoid. In another embodiment, the PCB of the second solenoid assembly is wrapped around and bonded to the solenoid.

BRIEF DESCRIPTION OF THE DRAWINGS

The present invention will now be described, by way of example, with reference to the accompanying drawings, in which.

Corresponding reference characters indicate corresponding parts throughout the several views. The exemplifications set out herein illustrate currently preferred embodiments of the invention, and such exemplifications are not to be construed as limiting the scope of the invention in any manner.

DESCRIPTION OF THE PREFERRED EMBODIMENTS

Figure 1:
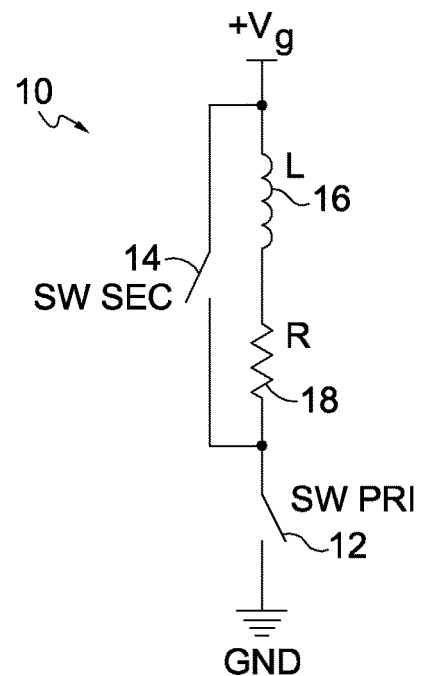
FIG. 1 is a functional schematic of a switching circuit, in accordance with an aspect of the present invention.

A functional schematic of the switching circuit 10 that produces constant current in an inductive load via switches controlled by pulse-width modulation (PWM) is shown in FIG. 1. There are two switches; a primary switch 12 and a secondary switch 14. When primary switch 12 is closed, the secondary switch 14 is open. When the primary switch 12 is open, the secondary switch 14 is closed. The series resistance (R), indicated in the circuit as resistor 18, is the sum of the coil resistance and the load resistance. Coil inductance and total circuit resistance comprise the inductive load.

When primary switch 12 is closed, source voltage ($V_s$) is applied across inductor ("coil") 16 and resistor 18. However since coil 16 opposes any change in current flow by producing a counter electromotive force (EMF) equal to the source voltage, current flow through coil 16 and resistor 18 is zero at the instant the primary switch 12 is closed, i.e., ($t_0$). Once primary switch 12 is closed, the counter EMF begins to decay until the voltage across coil 16 and resistor 18 equals the source voltage $V_s$, thereby allowing a current to flow through coil 16 and resistor 18. The time interval in which primary switch 12 is closed may be defined as $t_{on}$.

At the beginning of the time interval when secondary switch 14 is closed and primary switch 12 is opened (i.e. from $t_{on}$ until the end of the cycle (T)), there is no longer a source voltage Vs across coil 16. Once again, coil 16 opposes the change in current flow by producing a positive EMF equal to the source voltage Vs in the direction that was the source voltage's direction. Therefore, current continues to flow through coil 16 and resistor 18 without source voltage Vs being applied. From $t_{on}$ to the end of the cycle T, current through and voltage across coil 16 and resistor 18 decays to zero via the EMF discharged by coil 16. As such, the current in the inductive load is dependent upon the circuit parameters and the rate at which the switches 12 and 14 are opened and closed with respect to each other. This rate is the PWM frequency (f).

From the above discussion, it can be understood that current flow may be held constant by increasing the frequency in which the switches 12 and 14 are opened and closed. If the primary switch 12 is closed before the current decays to zero, the initial current becomes the boundary current. The load current is equal to the boundary current at the beginning and end of each period T. Non-zero boundary current increases the average value of the load current. As the period T is decreased substantially less than the L/R time constant, wherein L/R is the ratio of coil inductance to circuit resistance, the current may be held to any value between 0 and Vs/R by varying the duty ratio of primary switch 12, where the duty ratio is defined by $t_{on}/T$. This constant current control is especially useful since, in the example of a magnetic lock or solenoid driver, power to the lock can be precisely controlled by varying the duty ratio (i.e., power can be increased to resist an instantaneous and unwanted attempt to open the door yet be reduced while the door is at idle). That is, for a sufficiently high frequency, the current is constant and can be maintained by a PWM controller so as to be any value between 0 and $V_s/R$.

Figure 2:
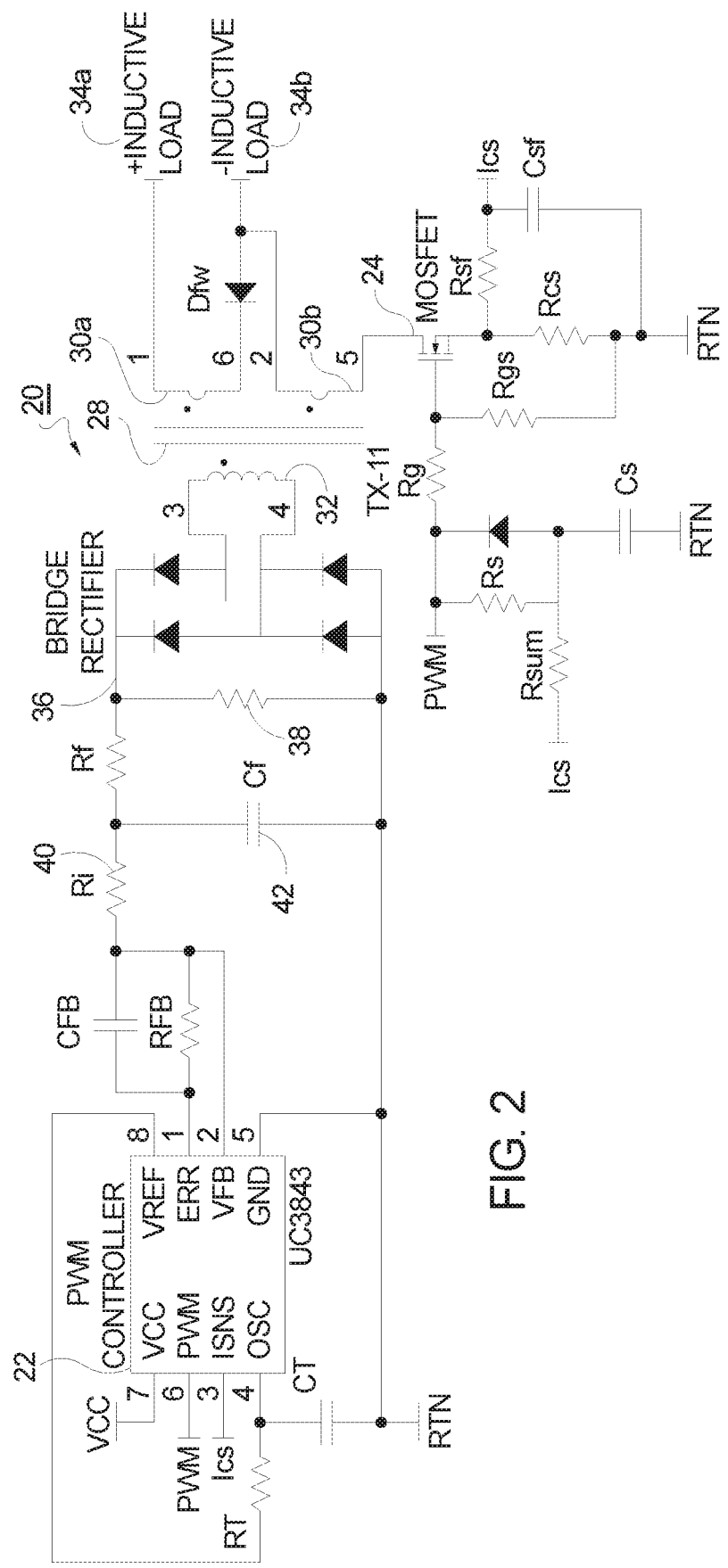
FIG. 2 is a schematic of an embodiment of a constant current PWM controller circuit, in accordance with an aspect of the present invention.

Further in regard to the disclosure made in the Parent Application, FIG. 2 depicts a constant-current controller circuit that may be used in conjunction with an electric latch or strike. It has been found that power to an access control device having inductive load actuator, such as but not necessarily limited to either a magnetic lock or a solenoid driver, is most efficiently provided if a constant current is provided to the inductive load actuator. An exemplary circuit 20 for a constant-current PWM controller 22 is shown in FIG. 2. The circuit makes use of a PWM controller integrated circuit 22 with current sensing used as the feedback mechanism. The primary switch 24 is typically a MOSFET (analogous to primary switch 12 described above) while the secondary switch 26 (i.e. switch 14) is typically a freewheeling diode (shown as "Dfw").

A current transformer 28 with two single-turn primary windings 30a and 30b and one secondary winding 32 with N-turns is used to sense the two components of the load current 34a and 34b. Primary windings 30a and 30b are connected in series with switches 24 and 26, respectively. Secondary winding 32 is connected to a bridge rectifier 36, burden resistor ($R_B$) 38, and low-pass filter resistor ($R_f$) 40 and capacitor ($C_f$) 42. It should be noted that any component having an equivalent functionality to the current transformer 28 may be installed within circuit 20. For example, a skilled artisan will see that the current transformer 28 may be replaced with Hall-effect sensors specified to have similar functionality.

When primary switch 12 is on (MOSFET 24 in FIG. 2), the first current component flows through the primary winding at Terminals 3 and 4. This component is transformed to the secondary winding 32 as:

$$i_s = \frac{DV_s}{NR}, 0 \le t \le t_{on}$$

When primary switch 24 turns off, the coil current continues to flow, due to the stored energy, but is now diverted into the free-wheeling diode 26 (i.e. secondary switch 14). This second current component now flows through the primary winding at Terminals 1 and 2. Due to the arranged phasing of the current transformer 28, the second current component is transformed to the secondary winding 32 as:

$$i_s = -\frac{DV_s}{NR}, t_{on} \leq t \leq T$$

The secondary currents are rectified through bridge rectifier 36 to produce a constant current through the burden resistor 38:

$$i_B = \frac{DV_s}{NR}, 0 \leq t \leq T$$

The value of the burden resistor is calculated to produce a voltage that is equal to the internal voltage reference, $V_r$, of the integrated circuit:

$$R_B = \frac{NRV_r}{DV_s}$$

Thus, the value of burden resistance 38 establishes the feedback voltage to the PWM controller 22 at $V_r$. At this voltage, PWM controller 22 regulates the current through the inductive load to maintain the feedback voltage at this operating point. Thus, the value of $R_B$ establishes the value of the constant current through the inductive load.

Figure 3:
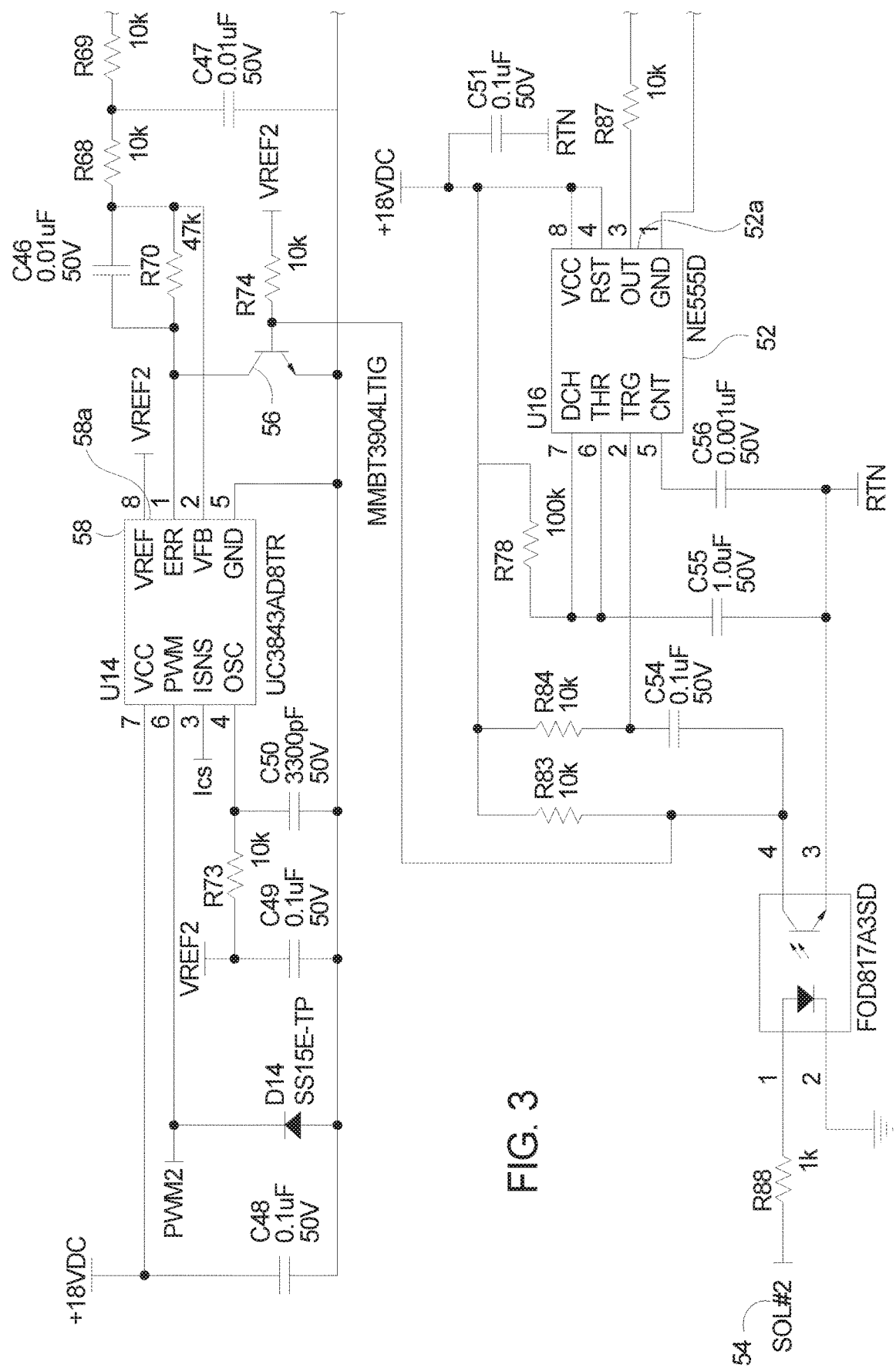
FIG. 3 is a schematic of another embodiment of a constant current PWM controller circuit configured for pick and hold states, in accordance with a further aspect of the present invention.
Figure 3:
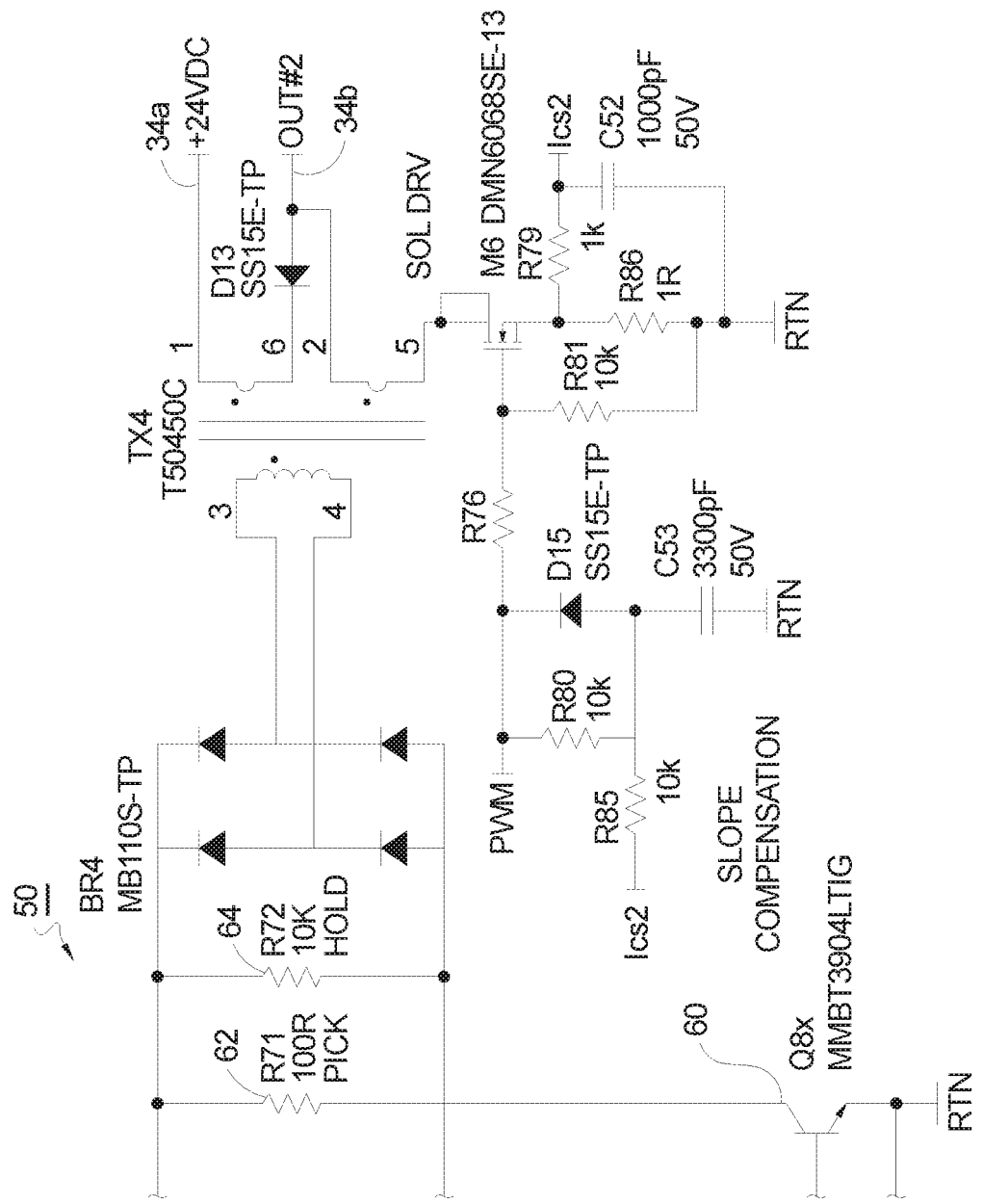

Still further in regard to the disclosure made in the Parent Application, FIG. 3 shows another exemplary circuit schematic 50 that may be suitable for use in conjunction with an electric latch or strike which employs a solenoid. As is recognized in the art, solenoid-driven actuators have long been known for their power inefficiencies. Since their pull-in current (pick current) is higher than the current needed to hold the solenoid plunger in place (hold current), to save energy, it is desirable for the controller to step down the current after the fixed duration of time during which the pick current has been applied.

To improve energy efficiencies, circuit 50 may use a combination of individual resistors in parallel to produce a collective burden resistor that may be used to change the operating current in the solenoid. In the case of a solenoid, two operating points are required, with the first being the pull-in or pick current. This relatively large current is sourced into the solenoid coil for a short time interval to engage the solenoid. Once the solenoid has been actuated, the pick current is followed by a much smaller holding or hold current to maintain the position of the solenoid plunger. In accordance with an aspect of the present invention, this pick and hold operation may be accomplished using a constant current controller by changing the value of the burden resistor once the solenoid has engaged, as will be discussed in greater detail below.

In reference to FIG. 3, circuit 50 makes use of a timer integrated circuit 52 to establish the time interval of the pull-in operation. The timer receives a signal through input 54 that initiates the pull-in interval. With no signal applied, transistor 56 (Q7) is on, Pin 1 (58*a*) of PWM controller 58 (U14) is pulled to ground such that PWM controller 58 is disabled. As a result, no current flows through the solenoid coil connected at terminals 34*a* (+24VDC) and 34*b* (OUT#2).

When input 54 is switched to logic-level HIGH, PWM controller 58 is enabled and the pick interval starts with a logic-level HIGH at the OUT pin (52*a*) of timer integrated circuit 52. This output turns on transistor 60 (Q8) and connects resistor 62 (R71) and resistor 64 (R72) in parallel. This combined resistance value establishes the value of the pull-in current. Once the pull-in interval has expired, OUT pin 52*a* returns to a logic-level LOW, transistor 60 (Q8) turns off, and resistor 62 (R71) is disconnected from the circuit. Resistor 64 (R72) remains as the burden resistance and establishes the hold current of the solenoid. By way of example, if resistor 62 has a resistance of 100 ohms and resistor 64 has a resistance of 10,000 ohms and 24 V is being supplied, the pick current will be about 0.24 A (24 V/99 ohms=0.24 A) while the hold current will be about 2.4 mA (24 V/10,000 ohms=0.0024 A). In this manner, power efficiencies may be realized as high current is applied only for a set, limited period of time before the circuit switches to provide the less-demanding hold current. The above discussion with reference to FIGS. 1-3 was disclosed in the co-pending Parent Application.

A PCB, as known in the art, is a modular platform of electronic components that are interconnected to form a circuit. The structural base or substrate of the PCB is formed of an insulating material. The circuit itself is formed by a thin layer of conducting material deposited in a pattern on the insulating base. The necessary electronic components making up the desired circuitry are then placed on the surface of the insulating material and soldered to the deposited conducting material. Thus the overall size of the PCB is substantially dependent upon the types of electronic components needed to form the circuitry and the physical sizes of the electronic components. Further, while the PCB substrate may be approximately 1.5 mm thick and itself flexible, depending on the number of electronic components soldered to the substrate and their physical sizes, the resulting PCB may be rendered relatively rigid and inflexible.

The footprint of MOSFET 24 as disclosed in the Parent Application measures approximately 4.0 mm×5.0 mm and therefore requires a relatively large PCB to contain it and its supporting components. The thickness of MOSFET 24 is approximately 1.75 mm. As a result of these physical attributes of MOSFET 24, and the layout and construction of the necessary supporting electronic components, the size of its PCB becomes relatively large, measuring approximately 30.0 mm×40.0 mm, and is also rendered rigid and inflexible. Consequently, a dedicated space must be provided remote from the electromechanical device for mounting such a large PCB, making a retrofit of the constant-current controller circuit as disclosed in the Parent Application difficult and impractical.

The use of a Gallium Nitride FET (GaNFET) manufactured by Efficient Power Conversion Co. of El Segundo, Calif. 90245 (part no. EPC2039) as a primary switch in place of MOSFET 24 solves the problem. The physical size of a GaNFET is much smaller than a MOSFET. Therefore, the size of the PCB needed to support the GaNFET is much smaller. Thus, the smaller physical size of a GaNFET/PCB will enable the PCB to be mounted directly on an associated solenoid driver.

Figure 4:
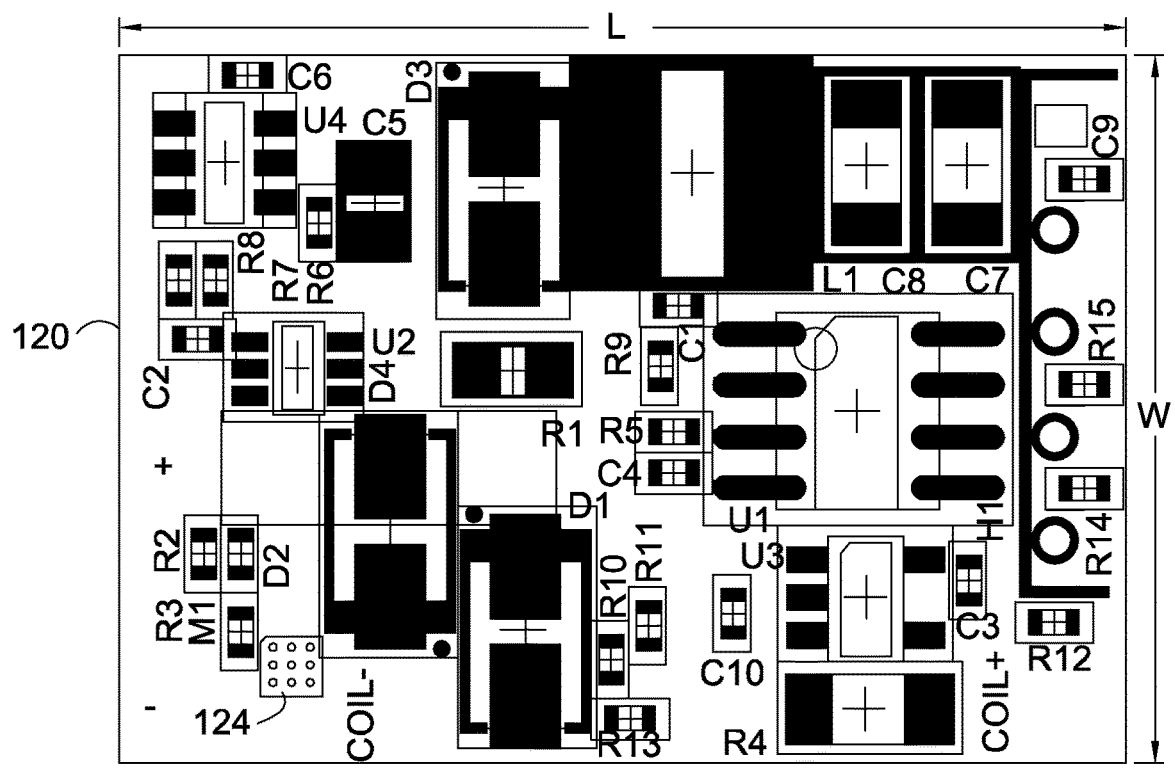
FIG. 4 is a generalized schematic of a PCB containing a GaFNET and its supporting electronic components in accordance with the invention.

Referring to FIG. 4, a magnified view of much smaller PCB 120 of a constant-current control circuit containing GaNFET 124 and its supporting electronic components is shown. The footprint of GaNFET 124 measures approximately 1.35 mm×1.35 mm and is much less than the footprint of MOSFET 24. Its thickness is also less than the thickness of MOSFET 24, measuring approximately 0.625 mm. The result is that a much smaller PCB 120 may be utilized, having a length (L) of approximately 24.1 mm and a width (W) of approximately 17.5 mm. Moreover, PCB 120 is rendered flexible via the use of GaNFET 124.

The use of GaNFET 124 as the primary switch in the circuit enables PCB 120 to be located within the framework of the associated electromechanical device and integrated with the associated solenoid driver itself, making the circuit of a prior art electromechanical devise easily upgraded to a constant-current controller circuit. The upgrade may be accomplished for the most part by a simple replacement of the solenoid driver.

Figure 5:
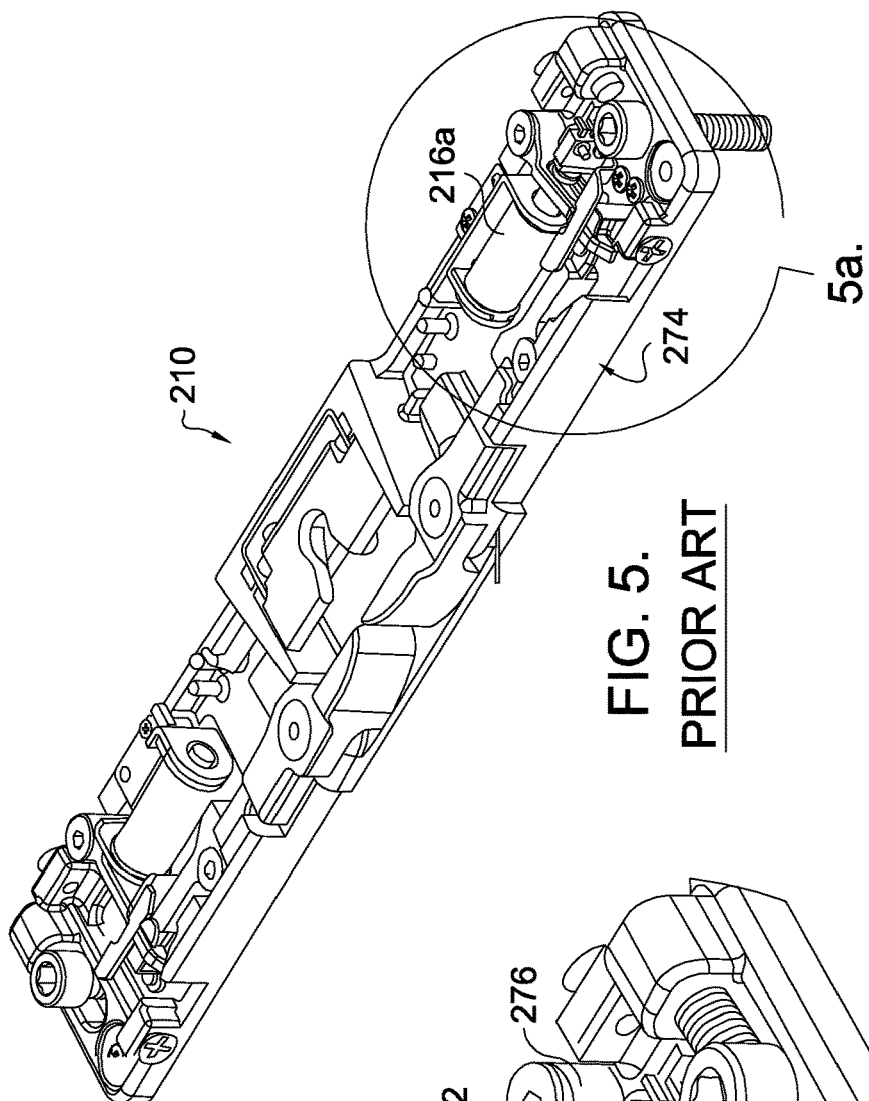
FIGS. 5 and 5A are views of a prior art electric strike assembly.
Figure 5A:
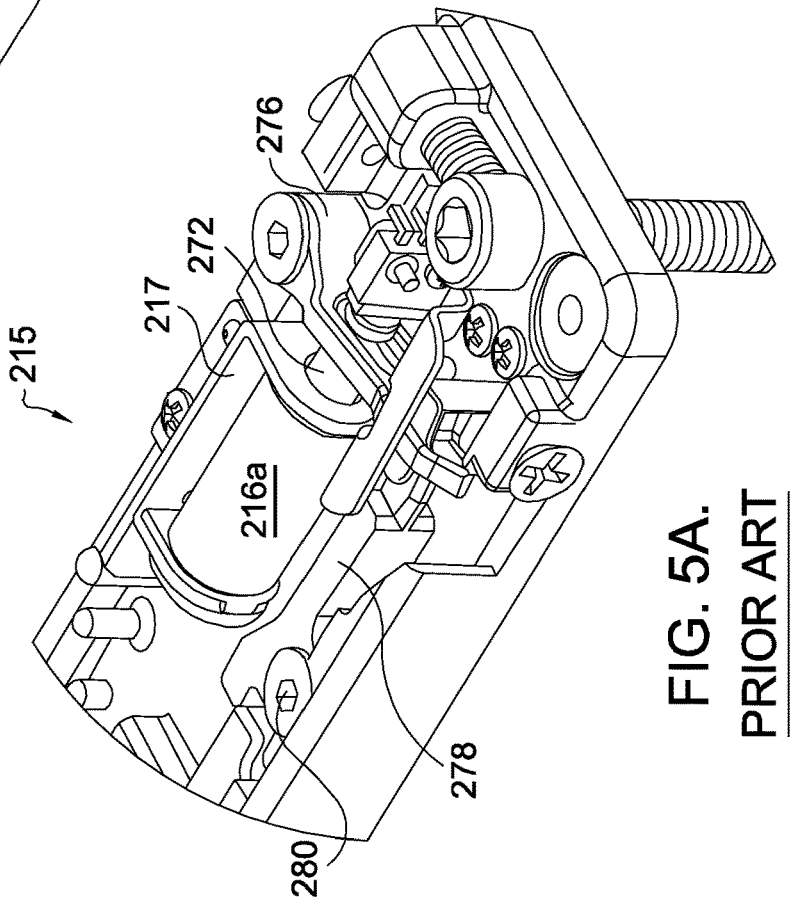

FIGS. 5 and 5A shows an example of a prior art electric strike assembly 210 as disclosed in U.S. Pat. No. 8,454,063. Electric strike assembly 210 utilizes two solenoid assemblies 215 and two solenoid drivers 216a to control release of keeper(s) 270 to their unlocked state. Each solenoid assembly includes solenoid driver 216a and solenoid bracket 217.

With reference to FIG. 5A depicting only one side of electric strike assembly 210, when solenoid driver 216a is energized and solenoid plunger 272 extends, actuating components 274 interact with each other to permit keeper 270 to move to its unlocked state. In the example of an electric strike assembly shown, upon extension of plunger 272, release lever 276 rotates, allowing transmission lever 278 to rotate about pivot 280 which in turn releases keeper 270 for movement to its unlocked state. Solenoid assembly 215, solenoid driver 216a and actuating components 274 are located within housing 282 of electric strike assembly 210.

Power for energizing solenoid driver 216a is provided by a switch (not shown) located remote from the strike assembly 210; a feed wire (not shown) connects the switch to solenoid driver 216a. In the example shown, the switch may be a button switch, a keypad, a swipe card, or the like. If strike assembly 210 were to be configured with constant-current circuits 20 or 50, because of its size, the PCB (with included MOSFET 24) would have to be mounted somewhere remote from electric strike assembly 210 making conversion of strike assembly 210 to constant-current circuit configuration difficult.

Figure 6A:
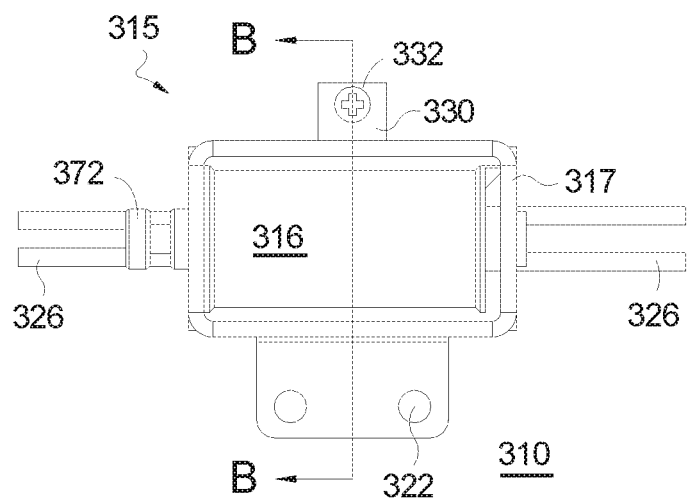
FIGS. 6A and 6B are views of a first embodiment of a solenoid assembly with integrated constant-current controller circuit in accordance with the invention.
Figure 6B:
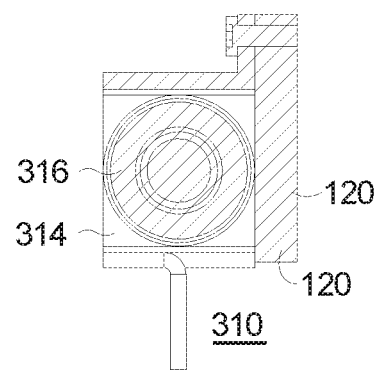

Referring to FIGS. 6A and 6B, in accordance with the invention, solenoid assembly 315, including integrated constant-current control circuit is shown. Solenoid assembly 315 includes solenoid bracket 317, solenoid driver 316 and generally planar PCB 120. Cavity 314 of bracket 317 is sized to receive solenoid driver 316. When solenoid driver 316 is energized, plunger 372 of solenoid driver 116 interacts with actuating components (not shown) of associated electromechanical device 310 such as an electrical latch or strike, thereby placing the latch or strike in its locked or unlocked state as known in the art. Flange 330 may extend outward from housing and includes mounting holes 322 for mounting solenoid assembly 315 to the associated electromechanical device 310 with appropriate fasteners (not shown). With the reduced footprint of GaNFET 124, PCB 120 may be attached with fastener 332 to solenoid driver 316 and made part of solenoid assembly 315. Feed wires 326 provide electrical connectivity to PCB 120 and to solenoid driver 316, as needed.

Thus, an electromechanical device 210 without a constant-current control circuit may be readily converted to one with a constant-current control circuit by:

a) providing a first electromechanical device 210 without a constant-current controller circuit, wherein the first electromechanical device 210 includes a first solenoid assembly 215 comprising a solenoid driver 216a;

b) removing the first solenoid assembly 215;

c) providing a second solenoid assembly 315 comprising a solenoid driver 316 and PCB 120;

d) replacing the removed first solenoid assembly 215 with second solenoid assembly 315; and e) making the required feed wire connections to convert the first electromechanical device 210 to a second electromechanical device 310 having said constant-current control circuit.

Figure 7A:
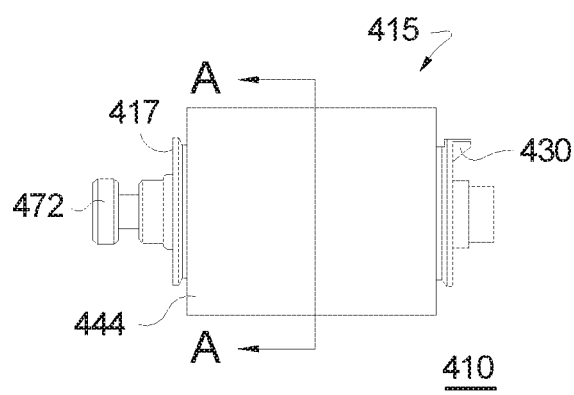
FIGS. 7A and 7B are views of a second embodiment of a solenoid assembly with integrated constant-current controller circuit in accordance with the invention.
Figure 7B:
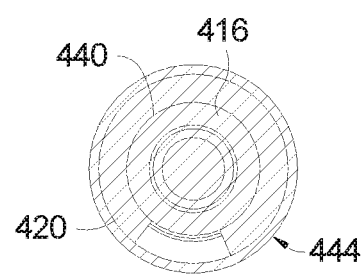

Referring to FIGS. 7A and 7B, an alternate embodiment of a solenoid assembly 415 with an integrated constant-current controller circuit is shown. Solenoid assembly 415 includes solenoid mounting bracket 417 and solenoid driver 416. When solenoid driver 416 is energized, plunger 472 of solenoid driver 416 interacts with components (not shown) of the electromechanical device shown schematically as 410. In the case of an electrical latch or strike, such interaction places the associated latch or strike in its locked or unlocked state as known in the art. Tab 430 may extend from mounting bracket 417 for mounting solenoid assembly 415 to the associated electromechanical device by appropriate means as known in the art. With the reduction in size of GaNFET 124, PCB 420 may be flexed into an arcuate shape as shown, assuming the general contour of the outer cylindrical surface of solenoid driver 416. The length (L) and circumference (C) of solenoid driver 416 are sized to accommodate the width (17.53 mm) and length (24.13 mm) of PCB 420, when flexed. As shown in FIG. 7B, flexed PCB 420 may be bonded to the cylindrical surface 440 of solenoid driver 416 as known in the art. A wrap 444 may then by placed over flexed PCB 420 for protection. Feed wires (not shown) provide electrical connectivity to PCB 420 and to solenoid driver 416, as needed. With respect to the embodiment shown in FIGS. 7A and 7B, an electromechanical device 210 without a constant-current control circuit may be readily converted to one with a constant-current controller circuit by:

a) providing a first electromechanical device 210 without a constant-current controller circuit wherein the first electromechanical device 210 includes a first solenoid assembly 215 comprising a solenoid driver 216a;

b) removing the first solenoid assembly 215;

c) providing a second solenoid assembly 415 comprising a solenoid driver 416 and integrated PCB 420;

d) replacing the removed first solenoid assembly 215 with said second solenoid assembly 415; and e) making the required feed wire connections to convert the first electromechanical device 210 to a second electromechanical device 410 having the constant-current controller circuit.

Thus, solenoid assemblies 315 and 415 may be built into an "as-manufactured" electromechanical device or serve as a "drop-in" replacement for a standard solenoid used in an existing electromechanical device thereby converting the standard circuit to a constant-current control circuit so as to provide the increased efficiency and power savings enjoyed by the circuit disclosed in the Parent Application.

While the invention has been described by reference to various specific embodiments, it should be understood that numerous changes may be made within the spirit and scope of the inventive concepts described. Accordingly, it is intended that the invention not be limited to the described embodiments, but will have full scope defined by the language of the following claims.

What is claimed is:

1. A method for converting a first electromechanical device without a constant-current control circuit to a second electromechanical device with said constant-current control circuit, wherein said first electromechanical device includes a first solenoid assembly comprising a first solenoid driver, said method comprising steps of:
 a) removing said first solenoid assembly from said first electromechanical device;
 b) providing a second solenoid assembly comprising a second solenoid driver having a Printed Circuit Board (PCB) integrated with and made a part of said second solenoid assembly, wherein said second solenoid driver includes an outer surface that extends along a length of said second solenoid driver, wherein said PCB is secured to said outer surface of said second solenoid driver and assumes a contour of said outer surface of said second solenoid driver, wherein said PCB includes a switching circuit having a primary GaNFET switch and a secondary switch, wherein said primary GaNFET switch and said secondary switch are connectable to a coil of said second solenoid driver;
 c) replacing the removed said first solenoid assembly with said second solenoid assembly; and
 d) making required feed wire connections to said second solenoid assembly to convert the first electromechanical device without said constant-current control circuit to said second electromechanical device having said constant-current control circuit.

2. The method in accordance with claim 1 wherein said PCB is generally planar and secured to said outer surface of said second solenoid driver with a fastener.

3. The method in accordance with claim 1 wherein said PCB is secured directly on said second solenoid driver.

4. The method in accordance with claim 1 wherein said first electromechanical device is a first electrical strike, and wherein said second electromechanical device is a second electrical strike.

5. The method in accordance with claim 4 wherein said second solenoid assembly includes a plunger.

6. The method in accordance with claim 5 wherein said plunger of said second assembly is positioned to interact with actuating components of said second electrical strike.

7. The method in accordance with claim 1 wherein said first electromechanical device is a first electrical latch, and wherein said second electromechanical device is a second electrical latch.

8. The method in accordance with claim 7 wherein said second solenoid assembly includes a plunger.

9. The method in accordance with claim 8 wherein said plunger of said second assembly is positioned to interact with actuating components of said second electrical latch.

10. A method for converting a first electromechanical device without a constant-current control circuit to a second electromechanical device with said constant-current control circuit, wherein said first electromechanical device includes a first solenoid assembly comprising a first solenoid driver, said method comprising steps of:
 a) removing said first solenoid assembly from said first electromechanical device;
 b) providing a second solenoid assembly comprising a second solenoid driver having a Printed Circuit Board (PCB) integrated with and made a part of said second solenoid assembly, wherein said PCB is formed into an arcuate shape, wherein said PCB is secured to a cylindrical outer surface of said second solenoid driver and assumes a contour of said cylindrical outer surface of said second solenoid driver, wherein said PCB includes a switching circuit having a primary GaNFET switch and a secondary switch, wherein said primary GaNFET switch and said secondary switch are connectable to a coil of said second solenoid driver;
 c) replacing the removed said first solenoid assembly with said second solenoid assembly; and
 d) making required feed wire connections to said second solenoid assembly to convert the first electromechanical device without said constant-current control circuit to said second electromechanical device having said constant-current control circuit.

11. The method in accordance with claim 10 wherein said PCB is secured directly on said second solenoid driver.

12. The method in accordance with claim 10 wherein said first electromechanical device is a first electrical strike, and wherein said second electromechanical device is a second electrical strike.

13. The method in accordance with claim 12 wherein said second solenoid assembly includes a plunger.

14. The method in accordance with claim 13 wherein said plunger of said second assembly is positioned to interact with actuating components of said second electrical strike.

15. The method in accordance with claim 10 wherein said first electromechanical device is a first electrical latch, and wherein said second electromechanical device is a second electrical latch.

16. The method in accordance with claim 15 wherein said second solenoid assembly includes a plunger.

17. The method in accordance with claim 16 wherein said plunger of said second assembly is positioned to interact with actuating components of said second electrical latch.

* * * * *